(12) United States Patent
Furukawa et al.

(10) Patent No.: US 7,250,347 B2
(45) Date of Patent: Jul. 31, 2007

(54) DOUBLE-GATE FETS (FIELD EFFECT TRANSISTORS)

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US); Peter H. Mitchell, Jericho, VT (US); Larry A. Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 10/905,979

(22) Filed: Jan. 28, 2005

(65) Prior Publication Data

US 2006/0172496 A1   Aug. 3, 2006

(51) Int. Cl.
   *H01L 21/336* (2006.01)
(52) U.S. Cl. ..................... 438/283; 438/176
(58) Field of Classification Search ............... 438/142, 438/157, 176, 195, 283; 257/74, 329, 347
   See application file for complete search history.

(56) References Cited

U.S. PATENT DOCUMENTS

| | | | |
|---|---|---|---|
| 4,097,986 A * | 7/1978 | Henry et al. | ................. 438/113 |
| 5,349,228 A | 9/1994 | Neudeck et al. | |
| 5,482,877 A * | 1/1996 | Rhee | ............................ 438/157 |
| 5,580,802 A | 12/1996 | Mayer et al. | |
| 5,612,563 A * | 3/1997 | Fitch et al. | .................. 257/329 |
| 5,646,058 A | 7/1997 | Taur et al. | |
| 5,677,550 A | 10/1997 | Lee | |
| 5,773,331 A | 6/1998 | Solomon et al. | |
| 5,780,327 A | 7/1998 | Chu et al. | |
| 6,316,296 B1 | 11/2001 | Sakamoto | |
| 6,423,599 B1 | 7/2002 | Yu | |
| 6,611,023 B1 | 8/2003 | En et al. | |
| 7,005,330 B2 * | 2/2006 | Yeo et al. | .................... 438/157 |

* cited by examiner

*Primary Examiner*—B. William Baumeister
*Assistant Examiner*—Jenny L. Wagner
(74) *Attorney, Agent, or Firm*—Schmeiser, Olsen & Watts; William D. Sabo

(57) ABSTRACT

A method for forming transistors with mutually-aligned double gates. The method includes the steps of (a) providing a wrap-around-gate transistor structure, wherein the wrap-around-gate transistor structure includes (i) semiconductor region, and (ii) a gate electrode region wrapping around the semiconductor region, wherein the gate electrode region is electrically insulated from the semiconductor region by a gate dielectric film; and (b) removing first and second portions of the wrap-around-gate transistor structure so as to form top and bottom gate electrodes from the gate electrode region, wherein the top and bottom gate electrodes are electrically disconnected from each other.

20 Claims, 9 Drawing Sheets

DOUBLE-GATE FETS (FIELD EFFECT TRANSISTORS)

BACKGROUND OF THE INVENTION

1. Technical Field

The present invention relates to double-gate FETs (Field Effect Transistors), and more specifically, to double-gate FETs whose double gates are electrically disconnected from each other.

2. Related Art

Dopant fluctuations are becoming a serious problem in Vt (threshold voltage) control in advanced semiconductor devices. As semiconductor devices become smaller and smaller in size, Vt control becomes more difficult. A known solution is to use back gates (in addition to front gates) in the semiconductor devices to control Vt. Without precise alignment between the top and bottom gates, however, the performance advantage of dual gates is decreased or lost completely.

As a result, there is always a need for new methods for forming transistors with aligned double gates. The present invention provides such a new method.

SUMMARY OF THE INVENTION

The present invention provides a semiconductor structure fabrication method, comprising the steps of (a) providing a wrap-around-gate transistor structure, wherein the wrap-around-gate transistor structure includes (i) a semiconductor region, and (ii) a gate electrode region wrapping around the semiconductor region, wherein the gate electrode region is electrically insulated from the semiconductor region by a gate dielectric film; and (b) removing first and second portions of the wrap-around-gate transistor structure so as to form top and bottom gate electrodes from the gate electrode region, wherein the top and bottom gate electrodes are electrically disconnected from each other.

The present invention also provides a semiconductor structure fabrication method, comprising the steps of (a) providing a semiconductor block embedded in a dielectric block; (b) etching a first trench through the semiconductor block and the dielectric block so as to form first and second semiconductor regions from the semiconductor block; (c) removing portions of the dielectric block such that a larger surface of the first semiconductor region is exposed to the atmosphere than before the portions of the dielectric block are removed; (d) forming a gate dielectric film on exposed-to-atmosphere surfaces of the first semiconductor region; (e) forming a gate electrode layer on the gate dielectric film, wherein the gate electrode layer is electrically insulated from the first semiconductor region by the gate dielectric film; (f) forming a gate electrode region from the gate electrode layer, wherein the gate electrode region, the gate dielectric film, and the first semiconductor region form a wrap-around-gate transistor structure, wherein the gate electrode region wraps around the first semiconductor region; and (g) removing first and second portions of the wrap-around-gate transistor structure so as to form top and bottom gate electrodes from the gate electrode region, wherein the top and bottom gate electrodes are electrically disconnected from each other.

The present invention also provides a new method for forming transistors with double gates.

DETAILED DESCRIPTION OF THE INVENTION

Figure 1A:
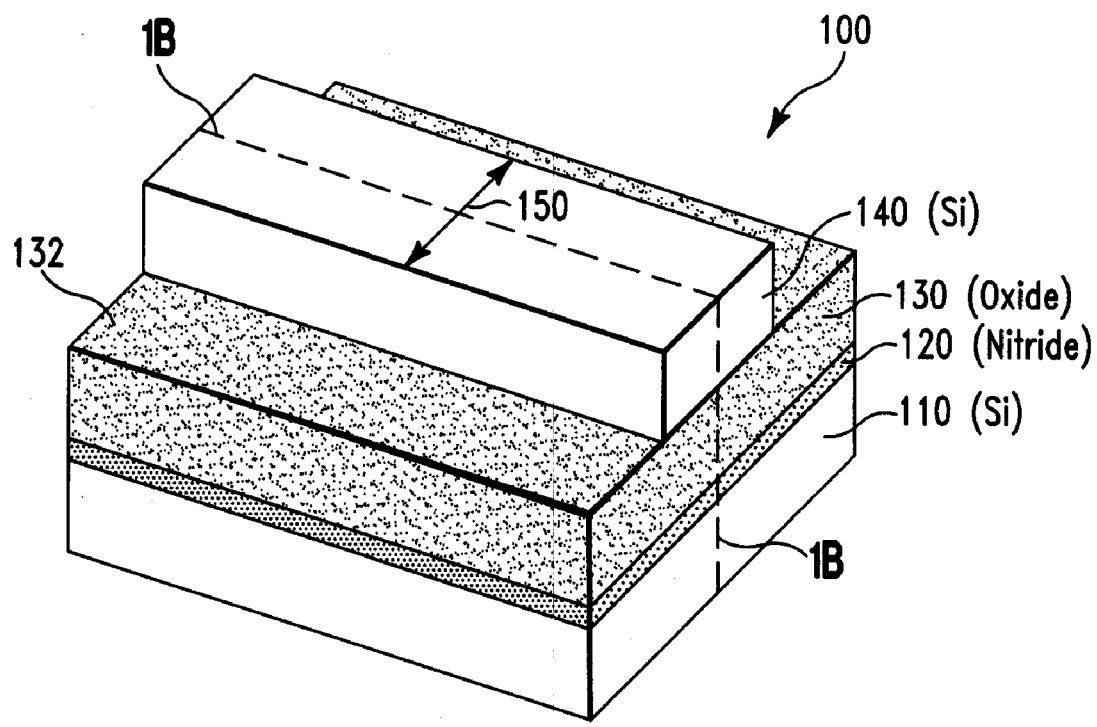
FIGS. 1-8 illustrate a fabrication method for forming a semiconductor structure, in accordance with embodiments of the present invention.

FIGS. 1-8 illustrate a fabrication method for forming a semiconductor structure 100, in accordance with embodiments of the present invention. More specifically, with reference to FIG. 1A, in one embodiment, the method can start out with a substrate 110,120,130. Illustratively, the substrate 110,120,130 can comprise a silicon layer 110, a nitride (e.g., silicon nitride) layer 120 on top of the silicon layer 110, and an oxide (e.g., silicon dioxide) layer 130 on top of the nitride layer 120.

Figure 1B:
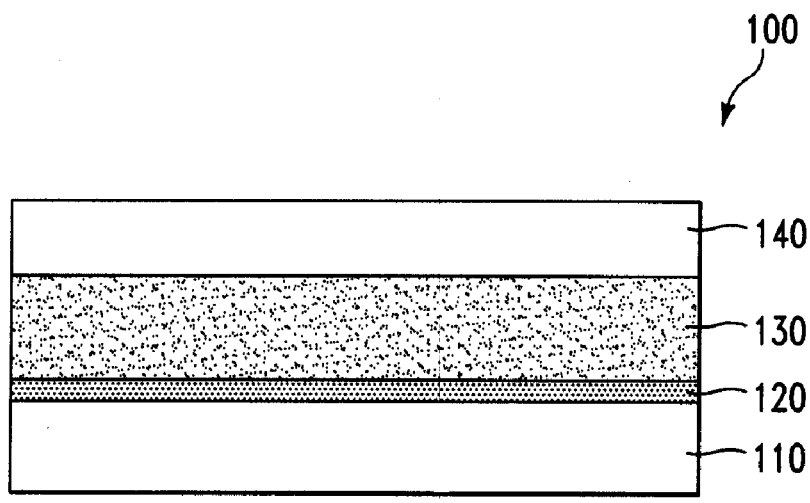

Next, a silicon region 140 can be formed on top of the oxide layer 130. In one embodiment, the silicon region 140 can be formed by first bonding the face of another semiconductor wafer (not shown) to the top surface 132 of structure 110,120,130, and then thinning that top wafer to its desired thickness using techniques known to experts in the field. Then, the bonded thinned silicon layer can be masked and etched to form the silicon region 140. FIG. 1A shows a perspective view of the resulting structure 100 after the silicon region 140 is formed. FIG. 1B shows a cross-section view of the structure 100 of FIG. 1A in the plane defined by the line 1B.

Figure 2A:
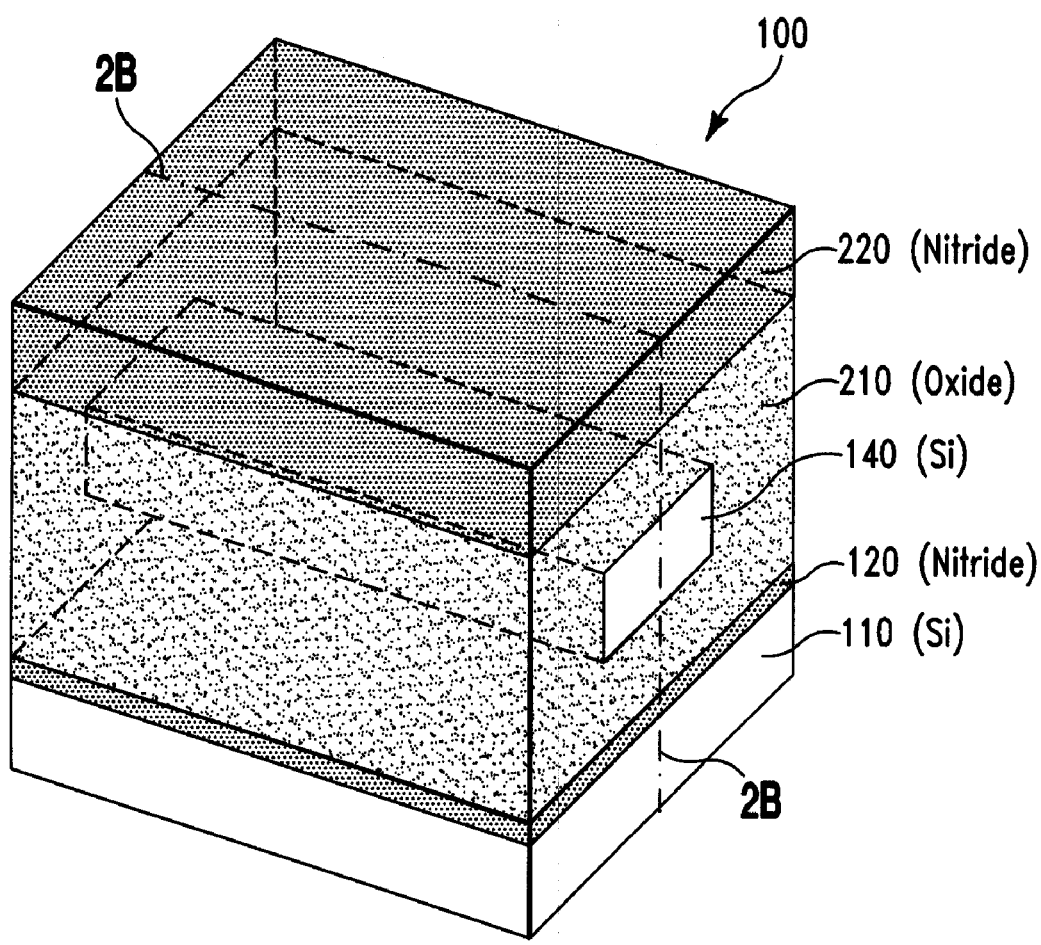

Next, with continued reference to FIG. 1A, silicon dioxide can be deposited on top of the entire structure 100 by, illustratively, CVD (chemical vapor deposition). The newly deposited oxide material merges with the oxide layer 130 to form a new oxide layer 210 (FIG. 2A). As a result, the silicon region 140 becomes buried (embedded) in the oxide layer 210 (FIG. 2A). This oxide is then planarized by, for example, chemical mechanical polishing (CMP) in order to provide a flat top surface.

Figure 2B:
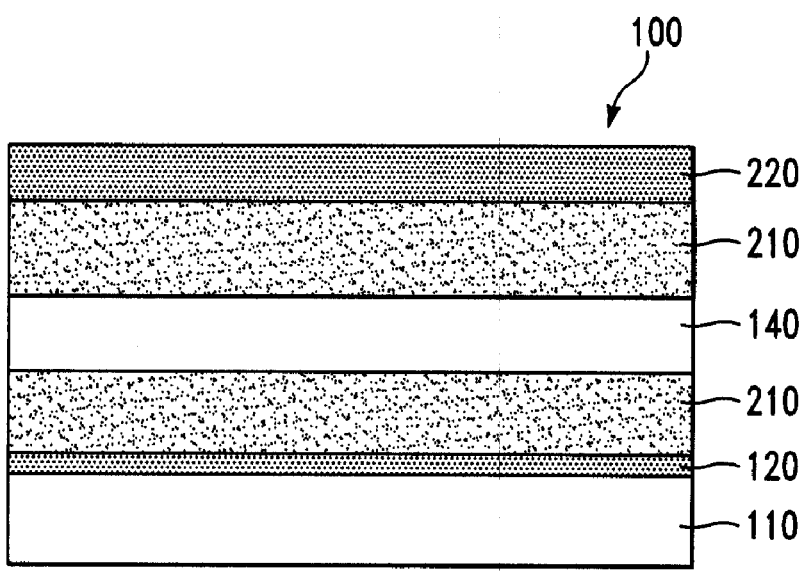

Next, with reference to FIG. 2A, a hard mask 220 can be formed on top of the planarized oxide layer 210. In one embodiment, the hard mask 220 can comprise a nitride material (e.g., silicon nitride). The nitride hard mask 220 can be formed by, illustratively, CVD. A perspective view of the resulting structure 100 after the formation of the hard mask 220 is shown in FIG. 2A. FIG. 2B shows a cross-section view of the structure 100 of FIG. 2A in the plane defined by the line 2B.

Figure 3A:
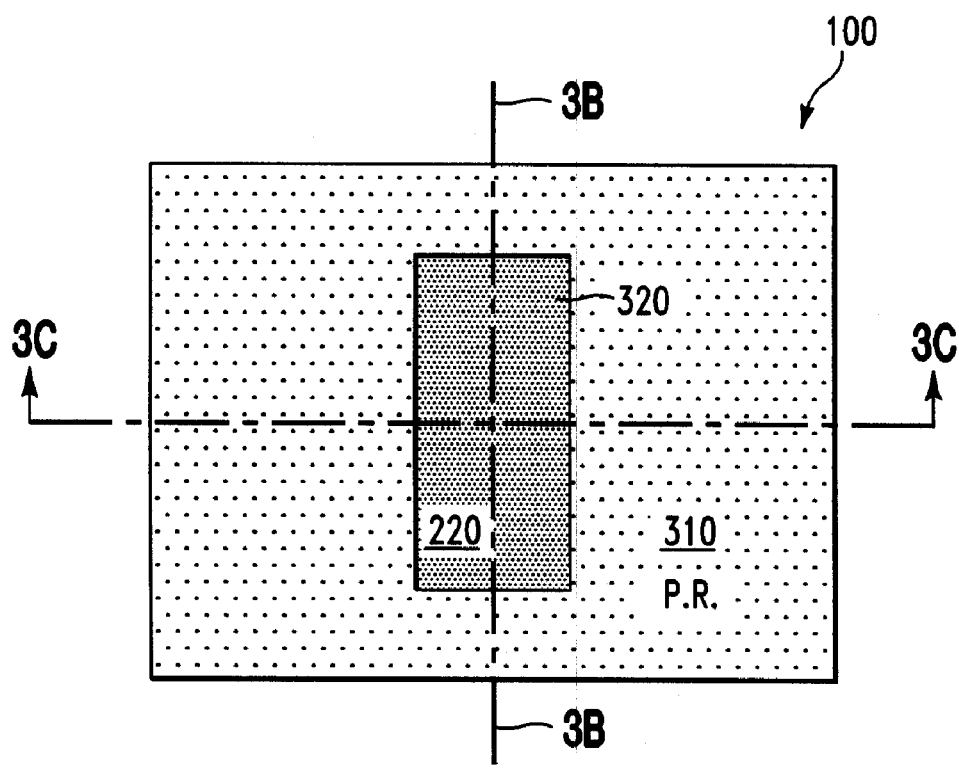

Next, with reference to FIG. 3A (a top view), a patterned photoresist layer 310 can be formed on top of the structure 100 of FIG. 2A. FIG. 3A shows a top-down view of the resulting structure 100 after the patterned photoresist layer 310 is formed. The patterned photoresist layer 310 can cover the entire top surface of the structure 100 except an opening 320. As a result, the hard mask 220 can be seen exposed to the atmosphere through the opening 320. In one embodiment, the patterned photoresist layer 310 can be formed by a conventional photolithography process.

Next, the patterned photoresist layer 310 can be used as a mask to etch (etch process #1) vertically down through different layers and regions of the structure 100 of FIG. 2A, stopping at the nitride layer 120. More specifically, etch process #1 etches through the hard mask layer 220, the oxide layer 210, and the embedded silicon region 140. Next, the patterned photoresist layer 310 can be removed.

Figure 3C:
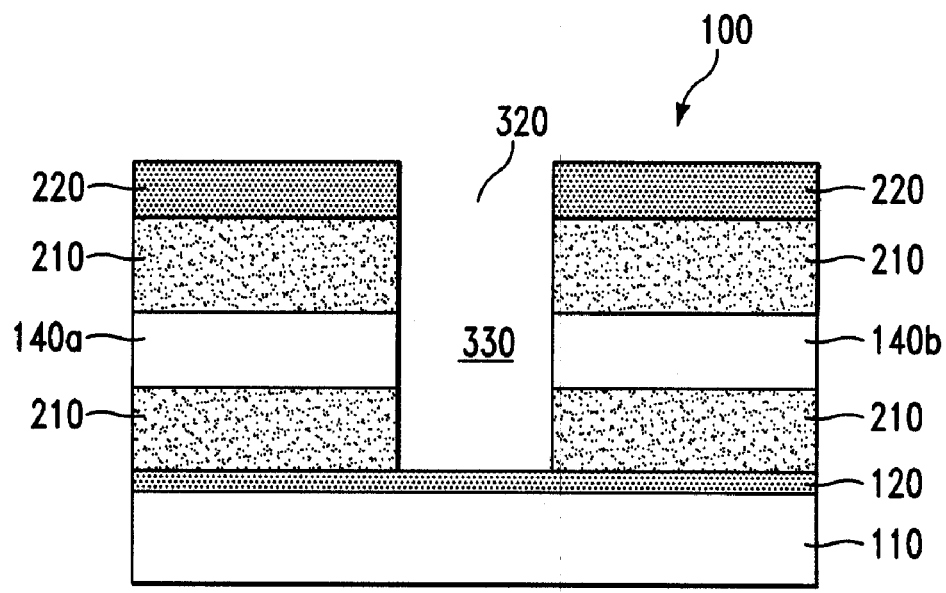
Figure 3B:
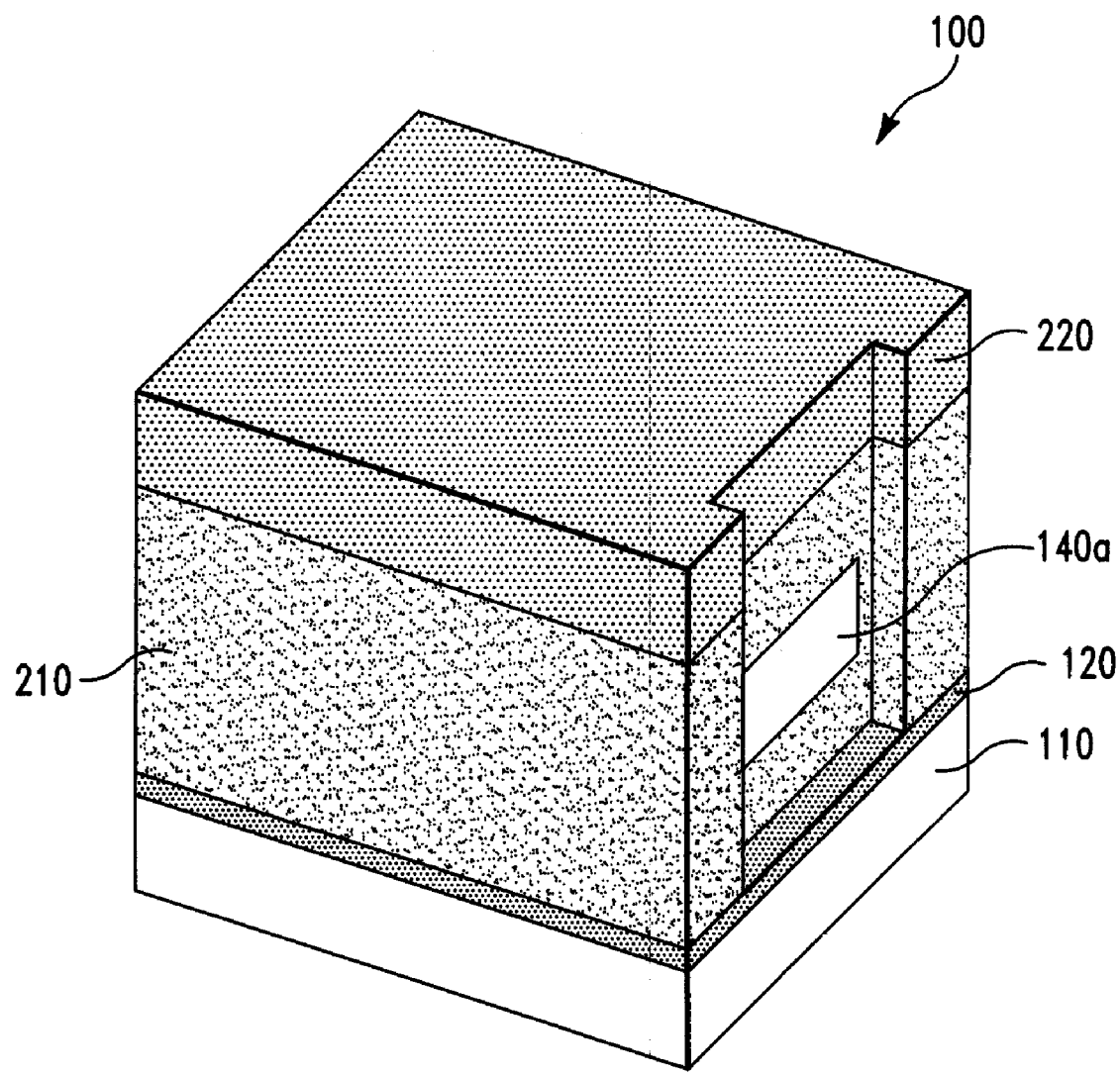

If the structure 100 of FIG. 3A (after etch process #1 is performed and the patterned photoresist layer 310 is removed) were cut vertically along the line 3B into left and right portions, FIG. 3B shows a perspective view of the left portion. With reference to FIG. 3B, etch process #1 cuts the silicon region 140 (FIG. 2A) into two physically separated silicon regions 140a and 140b of which only the silicon region 140a is shown in FIG. 3B (the silicon region 140b can be seen in FIG. 3C).

FIG. 3C shows a cross-section view of the structure 100 of FIG. 3A (after etch process #1 is performed and the patterned photoresist layer 310 is removed) along the line 3C-3C. As seen in FIG. 3C, a trench 330 is formed as a result of etch process #1.

Figure 4A:
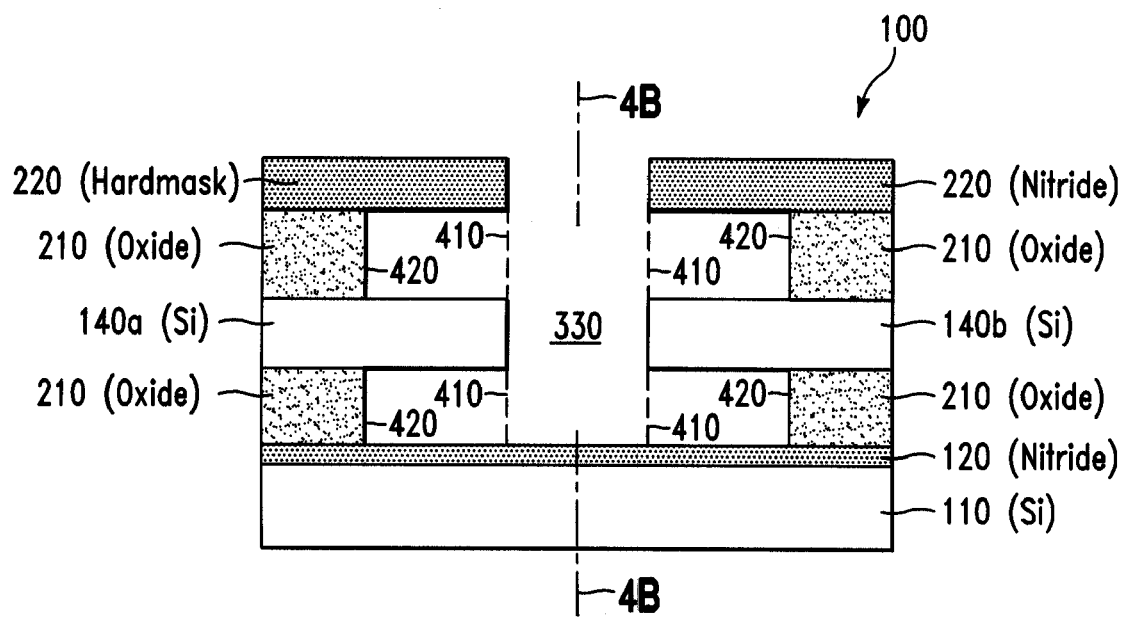
Figure 4B:
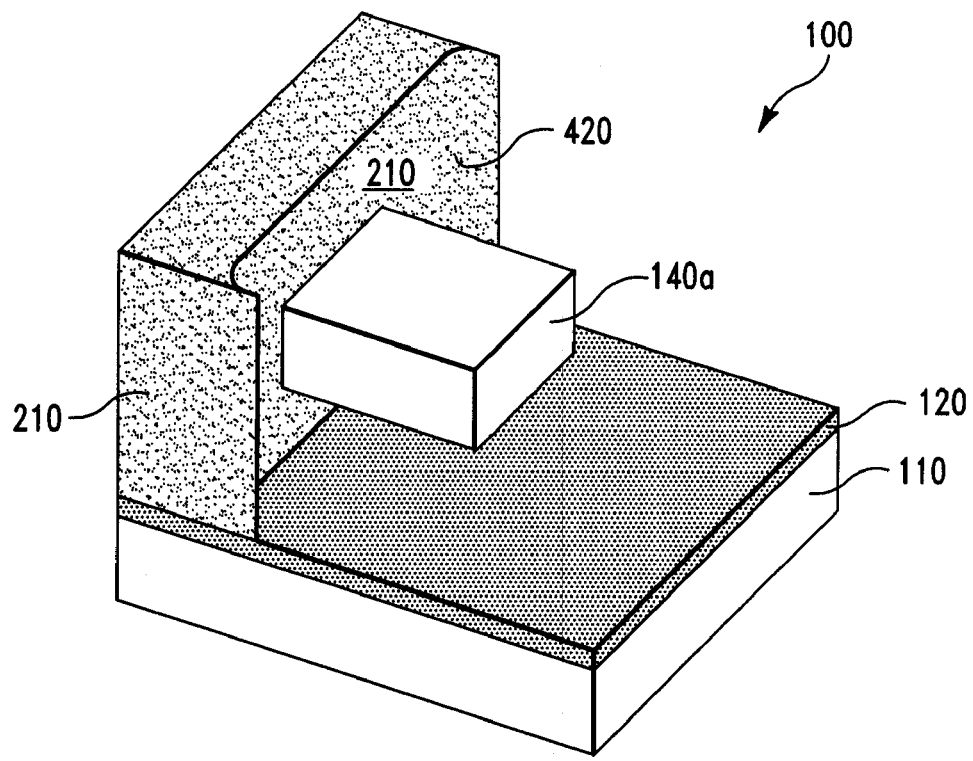

Next, with reference to FIG. 3C, the oxide layer 210, which is exposed to the atmosphere on side walls of the trench 330, can be isotropically etched (etch process #2). In one embodiment, etch process #2 can comprise a wet etch. FIG. 4A shows the structure 100 of FIG. 3C after etch process #2 is performed. With reference to FIG. 4A, as a result of etch process #2, the trench 330 is expanded laterally (horizontally) at the oxide layer 210. More specifically, the side wall portion 410 of the trench 330 corresponding to the oxide layer 210 before etch process #2 is performed becomes side wall portion 420 as a result of etch process #2. If the structure 100 of FIG. 4A were cut along the line 4B into left and right portions, FIG. 4B shows a perspective view of the left portion, with the hard mask 220 being omitted for simplicity.

Figure 5:
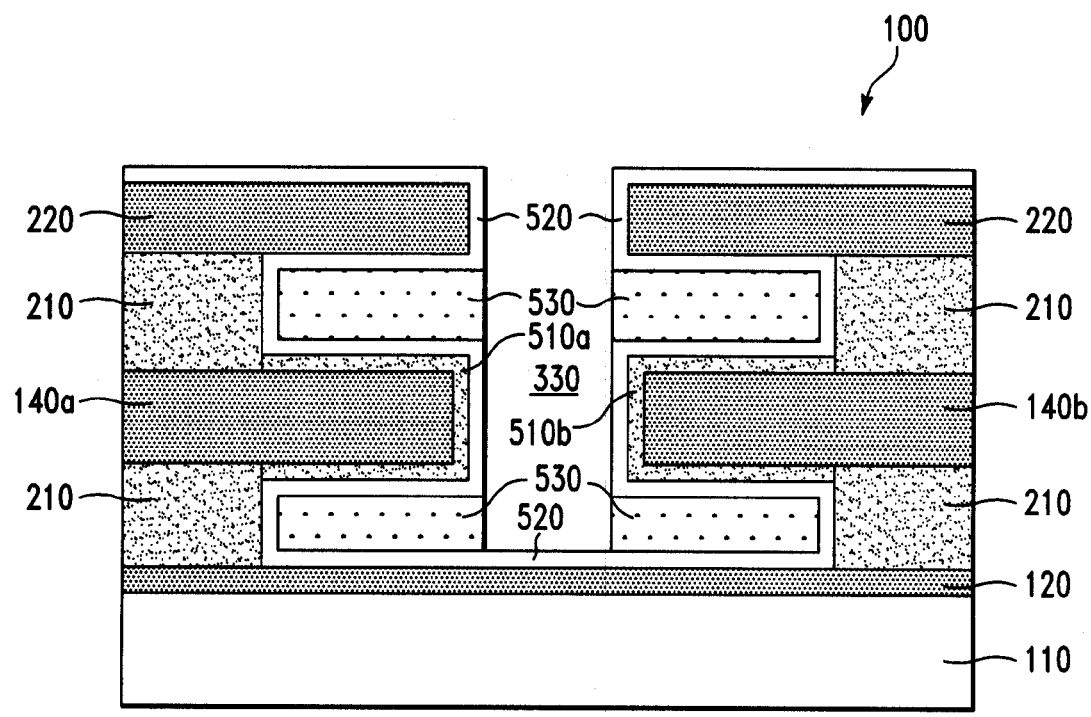

Next, with continued reference to FIG. 4A, the exposed-to-atmosphere surfaces of the silicon regions 140a and 140b can be thermally oxidized so as to form gate dielectric films 510a and 510b, respectively (FIG. 5). Alternatively, a thin layer of metal oxides or metal silicates can be deposited on the entire structure 100 of FIG. 4A to form the gate dielectric films 510a and 510b on the exposed-to-atmosphere surfaces of the silicon regions 140a and 140b, respectively.

Next, with reference to FIG. 5, a gate electrode layer 520 can be formed on exposed-to-atmosphere surfaces of the structure 100 (including walls of the trench 330). In one embodiment, the gate electrode layer 520 can be formed by CVD of polysilicon.

Next, an organic material can be deposited to completely fill the trench 330, including the spaces created by etch process #2. Then, an anisotropic etch process #3 can be performed to etch vertically down the filled trench 330 to remove some of the deposited organic material, essentially without affecting the gate electrode layer 520. The remaining portions of the deposited organic material form organic regions 530. FIG. 5 shows the structure 100 of FIG. 4A after etch process #3 is performed.

Next, an isotropic etch process #4 can be performed to remove portions of the gate electrode layer 520 essentially without affecting the organic material. As a result of etch process #4, the polysilicon gate electrode layer 520 is reduced to a gate electrode region 520' (FIG. 6A).

Figure 6A:
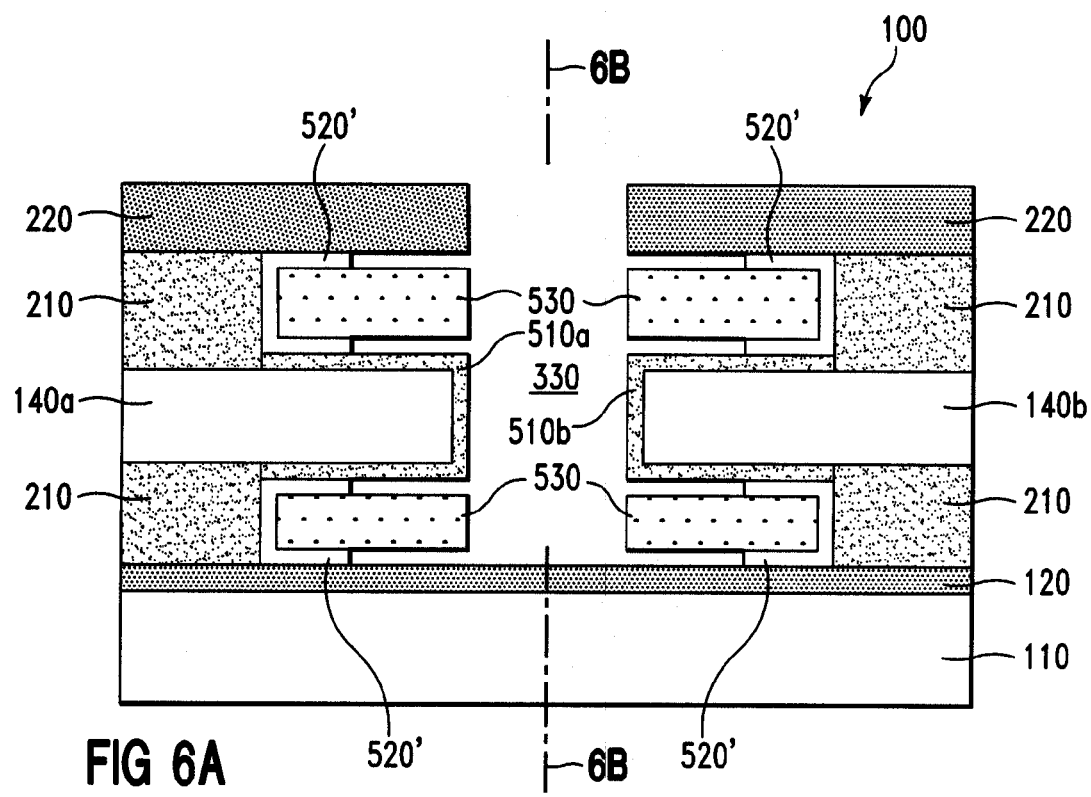

With reference to FIG. 6A, the gate electrode region 520' wraps around the silicon regions 140a and 140b. For that reason, the gate electrode region 520' can also be referred to as the wrap-around gate electrode region 520'.

Figure 6B:
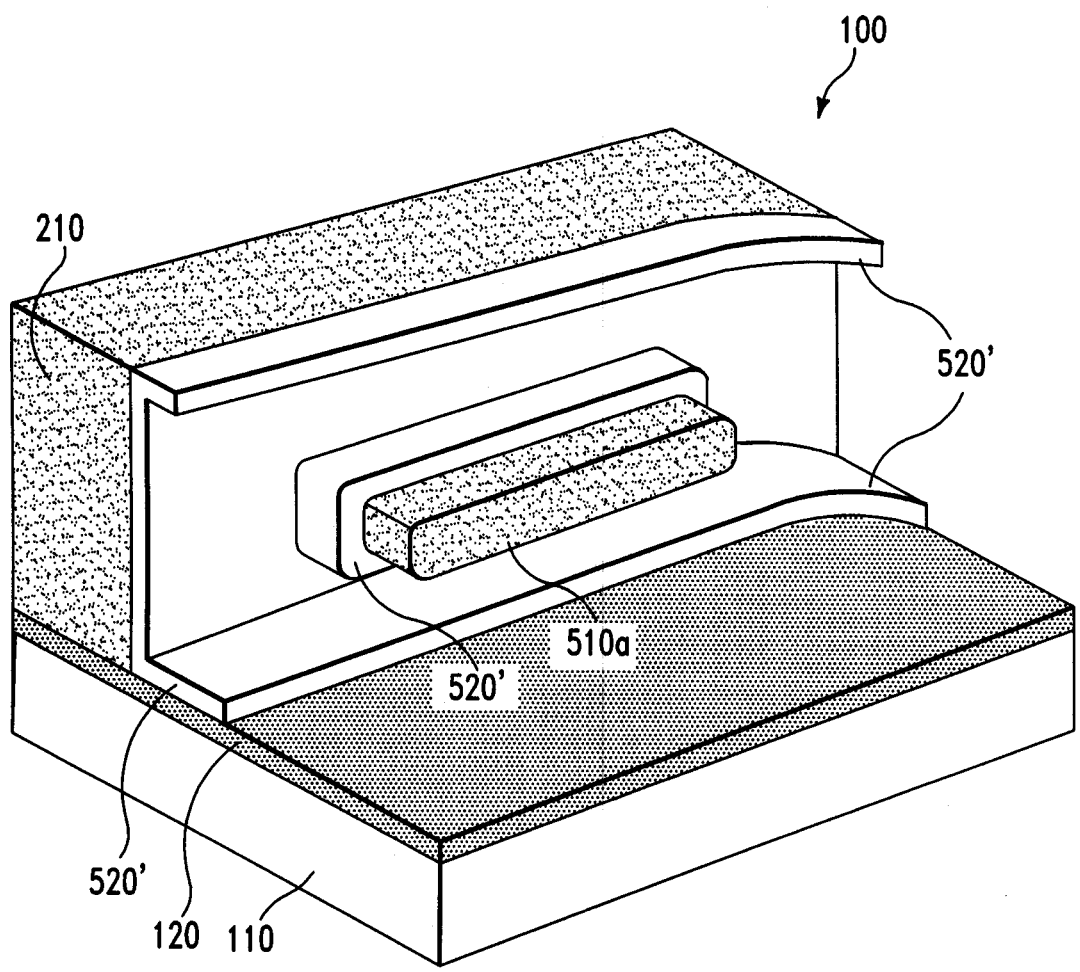

If the structure 100 of FIG. 6A (after etch process #4 is performed) were cut along the line 6B into left and right portions, FIG. 6B shows a perspective view of the left portion, (with the organic regions 530 and the hard mask 220 being omitted for simplicity).

Figure 7A:
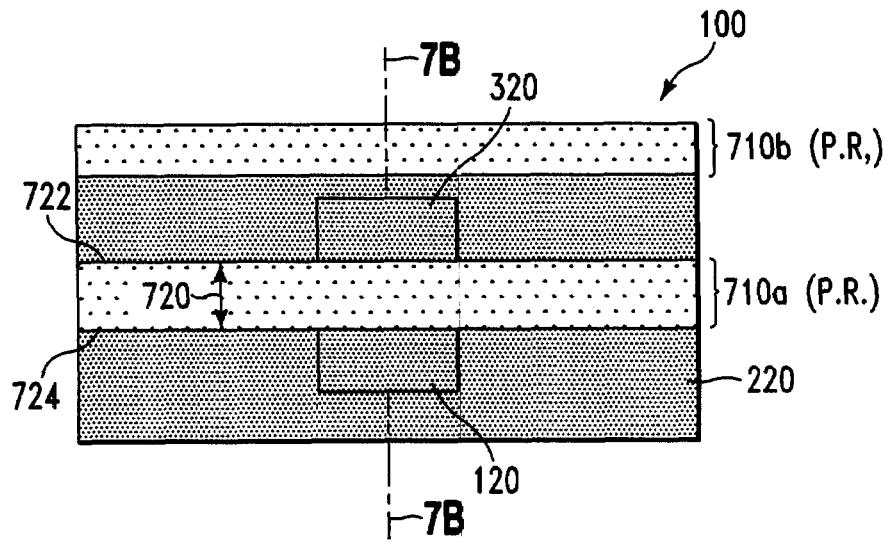

Next, with reference to FIG. 7A (a top view), a patterned photoresist layer 710a,710b comprising two photoresist stripes 710a and 710b can be formed on top of the structure 100 of FIG. 6A. FIG. 7A shows a top-down view of the resulting structure 100 after the patterned photoresist layer 710a,710b is formed. Then, an anisotropic etch process #5 can be performed using the patterned photoresist layer 710a,710b as a mask to etch vertically down through different regions of the structure 100 of FIG. 6A. Etch process #5 will be described further below.

After etch process #5, photoresist 710a, 710b, hard mask 220, and organic material 530 are removed. If the structure 100 of FIG. 7A (after photoresist 710a, 710b, hard mask 220, and organic material 530 are removed) were cut along the line 7B into left and right portions, FIG. 7B shows a perspective view of the left portion.

In one embodiment, the patterned photoresist layer 710a, 710b (more specifically, the photoresist stripe 710a) has size and shape such that after etch process #5 is performed the resulting gate electrode region 520' no longer wraps around the silicon regions 140a and 140b (FIG. 6A). More specifically, for the silicon region 140a, two polysilicon portions are removed from two opposing sides of the polysilicon ring of the gate electrode region 520' (FIG. 6A) that wraps around the silicon region 140a as a result of etch process #5. As a result, the polysilicon ring of the gate electrode region 520' (FIG. 6A) that wraps around the silicon region 140a is cut into two physically separated gate electrode regions 520a' and 520b' (which can be referred to as the top and bottom gate electrode regions 520a' and 520b', respectively). To achieve this result, the stripe 710a (FIG. 7A) can be positioned directly above the silicon regions 140a and 140b (FIG. 6A) and have a width 720 (FIG. 7A) less than the width 150 (FIG. 1A) of the silicon region 140. Similar structures are formed around the silicon region 140b (FIG. 6A) as a result of etch process #5.

Figure 7B:
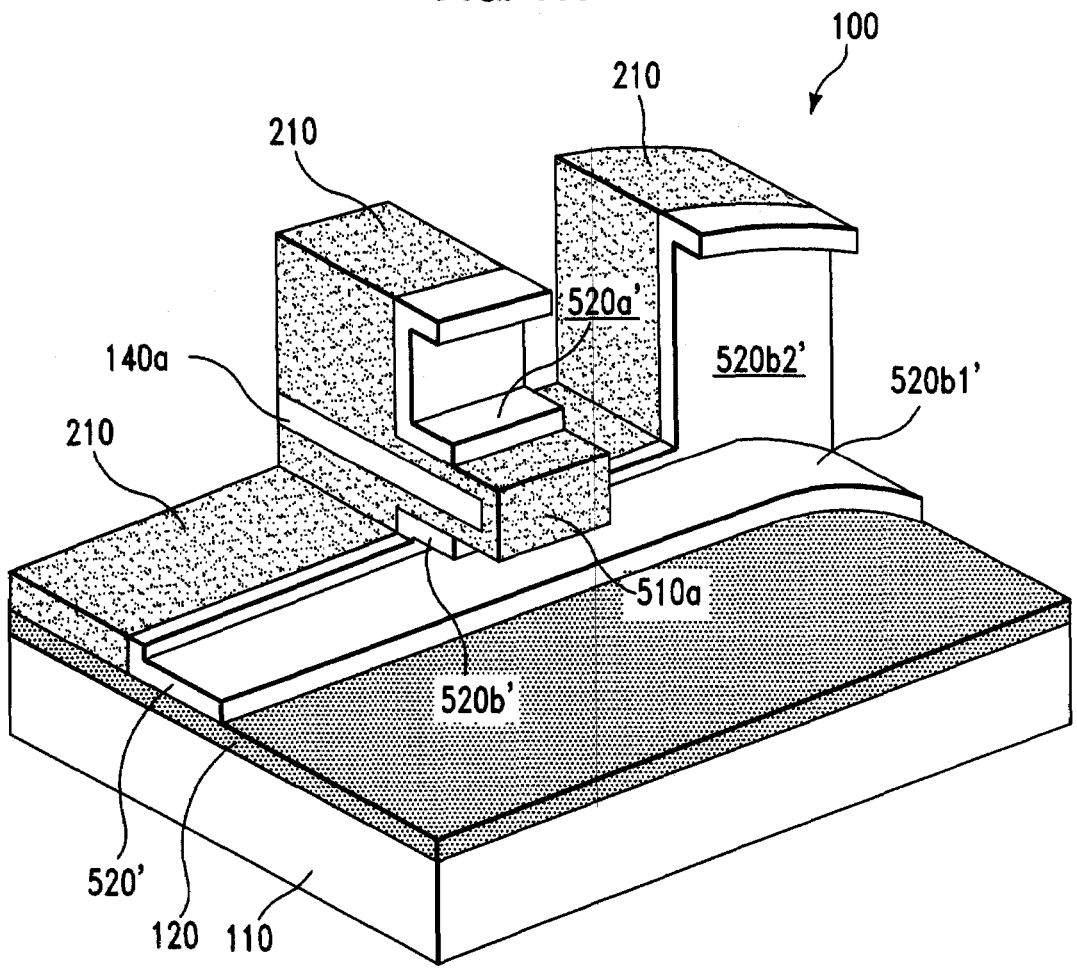

With reference to FIG. 7B, to achieve the structure 100 of FIG. 7B, the etch process #5 can comprise different etching steps that etch through different materials of different regions of the structure 100 of FIG. 6A. In one embodiment, etch process #5 can comprise etching through nitride of the hard mask layer 220, through oxide of the oxide layer 210, through polysilicon of the gate electrode region 520', through the organic material of the organic regions 530, and stopping after the portion of the gate electrode region 520' that wraps around the silicon region 140a is completely cut through but before the portion 520b1' of the gate electrode region 520' that rests on the nitride layer 120 is completely cut through. Also as a result, the bottom gate electrode region 520b' is still electrically connected to the bottom gate electrode portion 520b2' via the bottom gate electrode portion 520b1'. Also, the top and bottom gate electrode regions 520a' and 520b', respectively, are electrically disconnected from each other.

In one embodiment, etch process #5 can comprise RIE (reactive ion etching) steps having ion bombardments in a vertical downward direction. In one embodiment, the photoresist stripe 710a (FIG. 7A) has two parallel sides 722 and 724 so that etch process #5 cuts down on the structure 100 along two parallel cutting surfaces.

Next, exposed sidewalls of silicon regions 140a and 140b are passivated, preferably employing thermal oxidation to grow 2 nm to 8 nm of oxide, and source/drain regions 812 and 822 (FIG. 8) formed via implantation and activation anneal. Then, the entire structure 100 is filled by depositing a thick dielectric layer (not shown), preferably silicon dioxide or doped silicon dioxide, and planarizing the thick dielectric layer. This thick dielectric layer is omitted from drawings for clarity.

Figure 8:
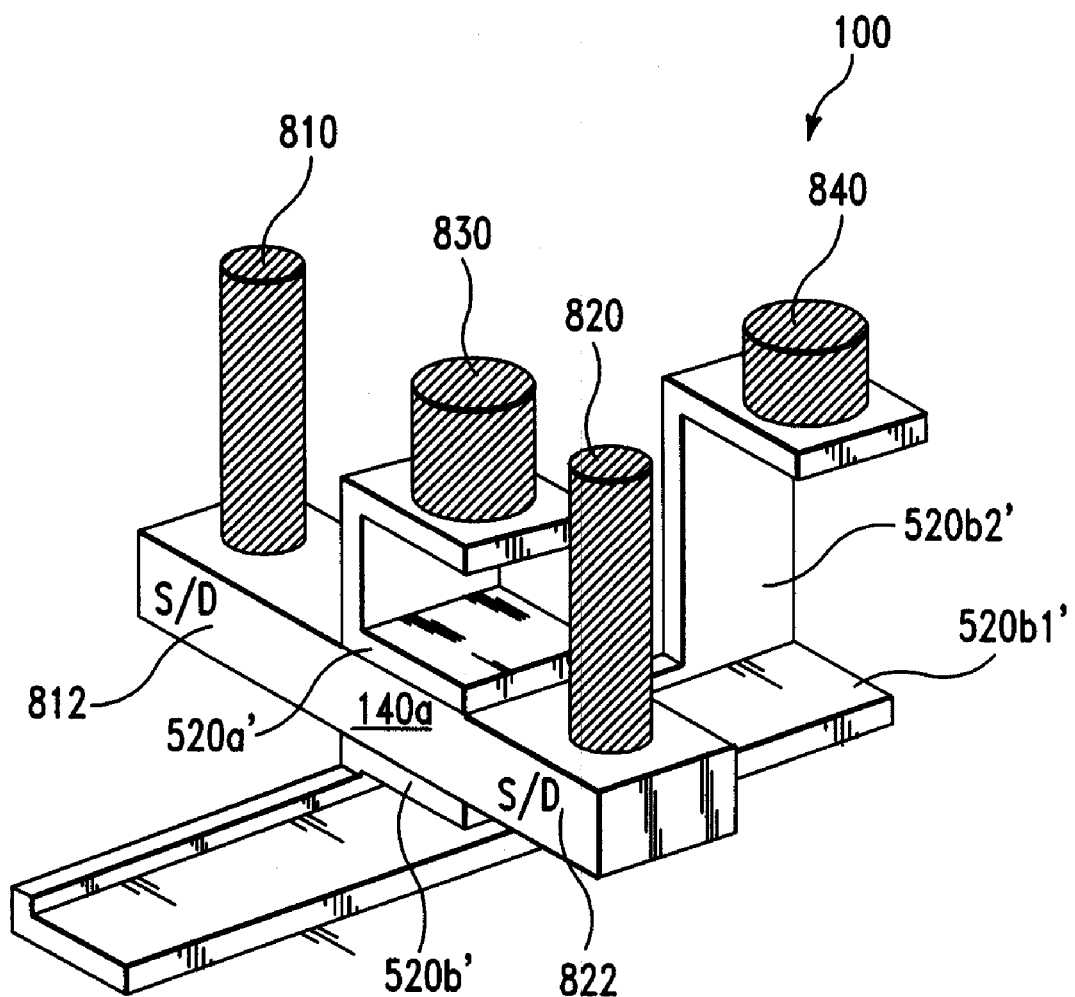

Next, with reference to FIG. 8, contact regions 810, 820, 830, and 840 can be formed in the planarized dielectric layer (using any conventional process) to electrically connect different regions of the structure 100 of FIG. 7B to an upper interconnect level (not shown). For simplicity, only the active silicon region and the gate electrode regions are shown. More specifically, the source/drain (S/D) regions 812 and 822 in the active silicon region 140a can be electrically connected to the upper interconnect level via the contact regions 810 and 820, respectively. The top gate electrode region 520a' can be electrically connected to the upper interconnect level via the contact region 830, whereas the bottom gate electrode region 520b' can be electrically connected to the upper interconnect level via the contact region 840. The resulting structure 100 after the contact regions 810, 820, 830, and 840 are formed is shown in FIG. 8. It should be also noted that similar contact regions (not shown) can be formed for the right half of the structure 100 (also not shown) so that the resulting structure 100 has two symmetric transistors only the left transistor of which is shown in FIG. 8.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure fabrication method, comprising the steps of:
   (a) providing a wrap-around-gate transistor structure, wherein the wrap-around-gate transistor structure includes
      (i) a semiconductor region, and
      (ii) a gate electrode region wrapping around the semiconductor region,
         wherein the gate electrode region is electrically insulated from the semiconductor region by a gate dielectric film, and
         wherein an intersecting plane intersects both the gate electrode region and the semiconductor region such that in the intersection plane, a first common interfacing surface of the intersecting plane and the gate electrode region forms a closed loop around a second common interfacing surface of the intersecting plane and the semiconductor region; and then
   (b) removing first and second portions of the wrap-around-gate transistor structure so as to form top and bottom gate electrodes from the gate electrode region, wherein the top and bottom gate electrodes are electrically discounected from each other.

2. The method of claim 1, wherein the gate electrode region comprises polysilicon.

3. The method of claim 1, wherein the gate dielectric film comprises an oxide material.

4. The method of claim 1, wherein the semiconductor region comprises silicon.

5. The method of claim 1,
   wherein step (b) removes the first and second portions of the wrap-around-gate transistor structure along first and second cutting surfaces, respectively, and
   wherein the first and second cutting surfaces are essentially parallel to each other.

6. The method of claim 5, wherein the step of removing the first and second portions of the wrap-around-gate transistor structure comprises the step of reactive ion etching of the first and second portions of the wrap-around-gate transistor structure, wherein the step of reactive ion etching has ion bombardment in a direction essentially parallel to the first and second cutting surfaces.

7. The method of claim 1, further comprising the step of forming first and second source/drain regions in the semiconductor region wherein the semiconductor region includes a channel region being disposed between the first and second source/drain regions and being sandwiched between the top and bottom gate electrodes.

8. The method of claim 1, wherein step (b) comprises the step of reactive ion etching the first and second portions of the wrap-around-gate transistor structure.

9. The method of claim 1, wherein step (a) comprises the steps of:
   providing the semiconductor region embedded in a dielectric block;
   removing portions of the dielectric block resulting in a surface of the semiconductor region being exposed to a surrounding ambient through a space of the removed portions of the dielectric block;
   forming a gate dielectric film on exposed-to-ambient surfaces of the semiconductor region; and
   forming the gate electrode region on the gate dielectric film, wherein the gate electrode region is electrically insulated from the semiconductor region by the gate dielectric film.

10. The method of claim 9, wherein the step of forming the gate dielectric film on the exposed-to-atmosphere surfaces of the semiconductor region comprises the step of depositing a thin layer of metal oxide material on the exposed-to-atmosphere surfaces of the semiconductor region.

11. A semiconductor structure fabrication method, comprising the steps of:
   (a) providing a semiconductor block embedded in a dielectric block;
   (b) etching a first trench through the semiconductor block and the dielectric block so as to form first and second semiconductor regions from the semiconductor block;
   (c) removing portions of the dielectric block such that a larger surface of the first semiconductor region is exposed to the atmosphere than before the portions of the dielectric block are removed;
   (d) forming a gate dielectric film on exposed-to-atmosphere surfaces of the first semiconductor region;
   (e) forming a gate electrode layer on the gate dielectric film, wherein the gate electrode layer is electrically insulated from the first semiconductor region by the gate dielectric film;
   (f) forming a gate electrode region from the gate electrode layer,
      wherein the gate electrode region, the gate dielectric film, and the first semiconductor region form a wrap-around-gate transistor structure,
      wherein the gate electrode region wraps around the first semiconductor region; and
   (g) removing first and second portions of the wrap-around-gate transistor structure so as to form top and bottom gate electrodes from the gate electrode region, wherein the top and bottom gate electrodes are electrically disconnected from each other.

12. The method of claim 11, wherein step (c) comprises the step of wet etching the portions of the dielectric block on a side wall of the first trench.

13. The method of claim 12, wherein the step of wet etching the portions of the dielectric block on the side wall of the first trench exposes a larger surface of the second semiconductor region than before the step of wet etching the portions of the dielectric block is performed.

14. The method of claim 11,
wherein step (g) comprises the step of etching the wrap-around-gate transistor structure in a first direction such that the resultant bottom gate electrode comprises first and second gate subportions,
wherein the first gate subportion is beneath the top gate electrode in the first direction,
wherein the second gate subportion is at essentially a same level as the top gate electrode in the first direction, and
wherein the first and second gate subportions are in direct physical contact with each other.

15. The method of claim 14, further comprising the step of forming first and second contact regions in direct physical contact with the top gate electrode and the second gate subportion, respectively.

16. The method of claim 11,
wherein step (g) comprises the step of etching the wrap-around-gate transistor structure in a first direction such that the resultant top and bottom gate electrodes comprise first and second top surfaces, respectively, in the first direction, and
wherein the first and second top surfaces are at essentially a same level in the first direction.

17. The method of claim 16, further comprising the step of forming first and second contact regions in direct physical contact with the top and bottom gate electrodes via the first and second top surfaces, respectively.

18. The method of claim 11,
wherein step (g) removes the first and second portions of the wrap-around-gate transistor structure along first and second cutting surfaces, respectively, and
wherein the first and second cutting surfaces are essentially parallel to each other.

19. The method of claim 18, wherein the step of removing the first and second portions of the wrap-around-gate transistor structure comprises the step of reactive ion etching of the first and second portions of the wrap-around-gate transistor structure, wherein the step of reactive ion etching has ion bombardment in a second direction essentially parallel to the first and second cutting surfaces.

20. The method of claim 11, further comprising the step of forming first and second source/drain regions in the first semiconductor region wherein the first semiconductor region includes a channel region being disposed between the first and second source/drain regions and being sandwiched between the top and bottom gate electrodes.

* * * * *